US006577157B1

(12) United States Patent
Cheung et al.

(10) Patent No.: US 6,577,157 B1
(45) Date of Patent: *Jun. 10, 2003

(54) FULLY PROGRAMMABLE I/O PIN WITH MEMORY

(75) Inventors: Sammy S. Y. Cheung, Pleasanton, CA (US); Krishna Rangasayee, Sunnyvale, CA (US)

(73) Assignee: Altera Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 84 days.

(21) Appl. No.: 09/187,545

(22) Filed: Nov. 5, 1998

Related U.S. Application Data
(60) Provisional application No. 60/065,551, filed on Nov. 14, 1997.

(51) Int. Cl.[7] .............................................. H03K 19/173
(52) U.S. Cl. ............................................ 326/38; 326/82
(58) Field of Search ............................ 326/37, 38, 41, 326/83, 86, 30

(56) References Cited

U.S. PATENT DOCUMENTS

| | | | | |
|---|---|---|---|---|
| 4,835,414 A | * | 5/1989 | Freidin ......................... 326/101 |
| 5,237,218 A | * | 8/1993 | Josephson et al. ............. 326/41 |
| 5,317,211 A | * | 5/1994 | Tang et al. .................... 326/86 |
| 5,627,839 A | * | 5/1997 | Whetsel ...................... 371/22.3 |
| 5,696,994 A | * | 12/1997 | Pang ........................... 327/334 |
| 5,834,949 A | * | 11/1998 | Oba .............................. 326/86 |
| 5,850,151 A | * | 12/1998 | Cliff et al. ..................... 326/40 |
| 5,973,530 A | * | 10/1999 | Morris et al. .................. 326/86 |
| 6,020,760 A | * | 2/2000 | Sample et al. ................. 326/41 |

OTHER PUBLICATIONS

Bursky, Dave, "Combination RAM/PLD Opens New Application Options", Electronic Design, pp. 138–140, May 23, 1991.
Intel Corporation, "10 ns FLEXlogic FPGA With SRAM Option", INTEL®, iFX780, pp. 2–24—2–46, Nov. 1993.
Ngai, Tony Kai–Kit, "An SRAM–Programmable Field–Reconfigurable Memory", Department of Electrical Engineering, University of Toronto, Thesis for Master of Applied Science, 1994.
Altera Corporation APEX 20K Programmable Logic Device Family, ALTERA® Oct. 1998, ver.1.

* cited by examiner

Primary Examiner—Don Le
(74) Attorney, Agent, or Firm—Beyer Weaver & Thomas LLP

(57) ABSTRACT

The present invention provides a programmable pin that may be selectively configured to operate as a signal pin or a power pin. A programmable pin provides increased flexibility in the design of integrated circuit devices. Programmable pins may also be used to provide better performance of the entire integrated circuit device and reduce noise in the pins of the integrated circuit device that are signal pins. The programmable pin may also include the function of retaining the last asserted state on the pin. Memory provides further functionality and flexibility in the design of integrated circuit devices.

18 Claims, 9 Drawing Sheets

FULLY PROGRAMMABLE I/O PIN WITH MEMORY

CROSS REFERENCE TO RELATED APPLICATIONS

This application claims benefit of priority under 35 U.S.C. 119(e) of U.S. Provisional Application No. 60/065,551, filed Nov. 14, 1997 and entitled "An Integrated Circuit Incorporating a Noise Tolerant Input/Output, " by Sammy S. Y. Cheung and Krishna Rangasayee, which is hereby incorporated by reference.

BACKGROUND OF THE INVENTION

The present invention relates generally to integrated circuit chips. More specifically, the present invention relates to input/output pins of integrated circuit chips.

Prior art semiconductor devices typically include input and output pins of semiconductor devices. Input and output pins receive and transmit electrical signals which allow the semiconductor device to communicate with other devices or systems. Semiconductor devices also include power pins that supply the integrated circuit with power. Both categories of pins are essential for the proper operation of a semiconductor device.

However, prior art input/output and power pins are typically not interchangeable. Once a pin is designated as an input, output, power or ground the pin cannot be utilized in any other manner. Recent advances have allowed a pin to operate as both an input and an output pin (also referred to as a bi-directional pin).

FIG. 1 is a schematic diagram of prior art input/output pin circuitry 100 and pad 105 of a conventional semiconductor device. Input/output circuitry 100 includes input buffer circuitry 101, output buffer 102 and pull-up circuitry 103.

Input buffer circuitry 101 receives electrical signals applied to pad 105 from external sources. The electrical signals are relayed to internal circuitry within the semiconductor device. Input buffer circuitry 101 normally consists of two transistors, a pull up transistor 104 and a pull down transistor 106, that act as a buffer to improve the signal integrity of the input signal from pad 105. When working properly, transistors 104 and 106 relay the electrical signals applied to pin 105 to the internal circuitry.

Output buffer circuitry 102 relays the electrical signals generated by internal circuitry and applies it to pad 105. Output buffer 102 usually provides high driving current (4 mA–20 mA) to charge and discharge the large capacitance (typically 50 pf to 150 pf) of the signal trace on the printed circuit board and pin capacitance of other components. In addition, output buffer circuitry 102 provides electrostatic discharge protection (ESD) to the internal circuitry of the semiconductor device. The output of the internal circuitry is initially passed through nor gates 115 and 117.

An output enable signal controls whether the output of the internal circuitry is transmitted to pad 105. The output enable signal is enabled when pad 105 is configured to be an output pin. Pull up transistor 110 and pull down transistor 112 pass along the output of the internal circuitry when the output enable signal is enabled.

When pad 105 is desired to be an input pin, the output enable signal is disabled. The output of transistors 110 and 112 is at indeterminate state, typically referred to as tri-state, as is well known in the art.

During operation, if pad 105 is left to "float", i.e. there is no supply voltage or the pin is left unconnected, a transient voltage or current pulse, otherwise referred to as noise, can cause the pull down transistor 106 and/or the pull up transistor 104 of the input buffer 101 to "turn on" such that they substantially conduct current. Both the pull up transistor 104 and the pull down transistor 106 conducting current simultaneously result in what is referred to as a crowbar current. The crowbar current flowing from VCC to VSS can be significant if a significant number of input buffers are floating at the same time. For example, a typical programmable logic device may contain 400 to 500 input buffers. If a high crowbar current is instantaneously conducted between VCC and VSS it may cause the VCC voltage to "sag" and cause the entire device to fail functionally. If the crowbar current is sustainable direct current, the device will consume more power and generate more heat.

Pull-up circuitry is often utilized in order to avoid the crowbar current effect. Pull-up circuitry 103 is typically used to drive the pin to a logical high when in tri-state. Pull-up circuitry 103 includes a transistor 122 and a resistor 120 which limits current when the pin is driven low from an exterior source. Pull-down circuitry may also be used to pull the pin low instead of high. Pull-up circuitry 103 is generally needed to avoid indeterminate signals from propagating to the internal circuitry of the semiconductor device. Such signals often times create oscillations and other spurious effects in the internal circuitry.

Generally, in this manner a pin can be used as both an input pin and an output pin, such a pin is known as an input/output (I/O) pin. However, the input/output pin cannot be used as a power or a ground pin. The lack of versatility of prior art pins reduce the versatility of semiconductor devices. Conventionally, once a pin is designated as an I/O pin it cannot be used as a power pin or a ground pin. Even in programmable logic devices the I/O pins cannot be designated as power or ground pins.

I/O pins also require, in most cases, pull-up or pull-down circuitry in order to avoid spurious conditions and harmful side effects caused by indeterminate states. Pull-up or pull-down circuitry can only drive a pin either high or low regardless of the previous state of the pin. However, often times it is desired to maintain the previous state of the pin rather than indiscriminately driving the pin high or low.

A programmable I/O pin that can also act as a power pin is, therefore, desired. Complete versatility would allow for better semiconductor devices. Additionally, a pin with memory of a previous state is also desirable.

SUMMARY OF THE INVENTION

The present inventions provide a programmable pin that may be selectively configured to operate as a signal pin or a power pin. Such a programmable pin provides increased flexibility in the design of integrated circuit devices. Programmable pins according to the present inventions may also be used to provide better performance of the entire integrated circuit device and reduce noise in the pins of the integrated circuit device that are signal pins. Further, the programmable pins may also include the function of retaining the last asserted state on the pins. The ability to provide programmable pins with memory provides further functionality and flexibility in the design of integrated circuit devices.

In one embodiment of the present inventions, a programmable pin includes a pad, an output buffer, a programmable circuit, and an input buffer. The pad is coupled to the output buffer and carries a signal asserted by the output buffer or by an external source. The output buffer is coupled to the programmable circuit. The programmable circuit determines which of the many modes in which the programmable pin may operate based upon a number of control signals. The input buffer is coupled to the pad and receives the signal asserted on the pad.

The programmable pin may operate in an input pin mode, output pin mode, input/output pin mode, a ground pin mode or a power supply pin mode.

In another embodiment of the present inventions, one of the control signals may be an output signal which is provided by the programmable circuit to the output buffer. The output signal is then asserted on the pad when the mode of operation involves outputting a signal through the pad.

The programmable pin may also include a memory circuit in yet another embodiment of the present inventions. The memory circuit retains a previous state asserted on the pad until a next state is asserted on the pad.

These and other advantages of the present inventions will become apparent to those skilled in the art upon a reading of the following descriptions of the invention and a study of the several figures of the drawing.

DETAILED DESCRIPTION OF THE PRESENT INVENTIONS

The present invention provides a programmable pin capable of acting as an input, output, power or a ground pin. The programmable pin may also be capable of maintaining the previous state of the pin.

Complete programmability provides many benefits. An integrated circuit device with programmable pins is more versatile in terms of pin assignment. Greater assignability of pins is especially useful in programmable devices. A programmable device with programmable pins can fully emulate the processing function of an integrated circuit device and also match the pin configuration of the integrated circuit device.

Programmable pins also provide better performance to a programmable device. Often times programmable devices do not fully utilize al the designated I/O pins. A programmable device with programmable pins can fully utilize all non-I/O pins as power pins. A greater number of power pins reduces noise and increases performance.

Programmable pins, in accordance with the present inventions, may possess the ability to remember the last state of the pin. Memory is useful when the previous logic state can be utilized by the internal circuitry of a semiconductor device utilizing programmable pins. Also, memory removes the need for pull-up or pull-down circuitry.

Figure 1:
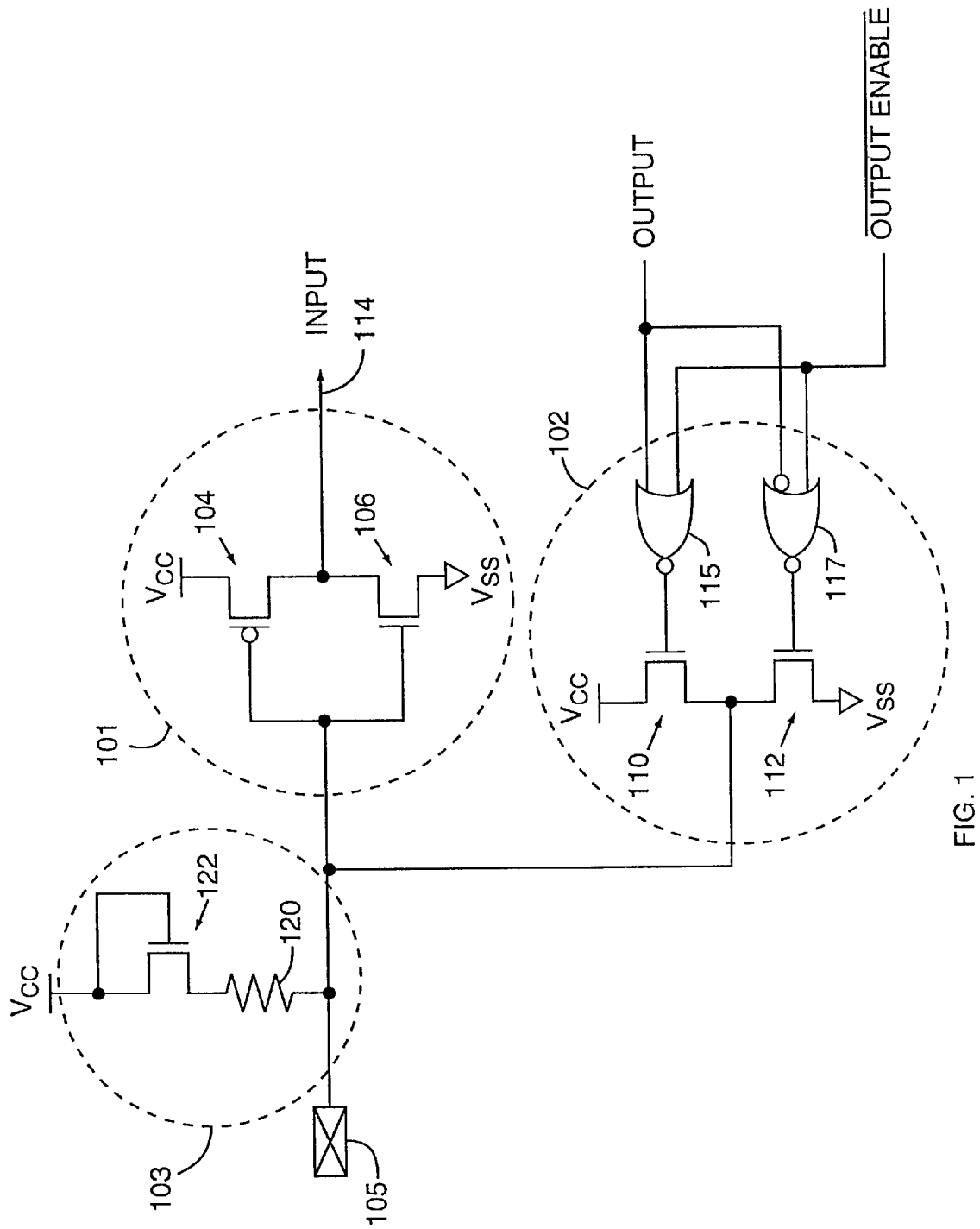
FIG. 1 illustrates a schematic diagram of an input/output pin circuitry and pad of a conventional semiconductor device.
Figure 2A:
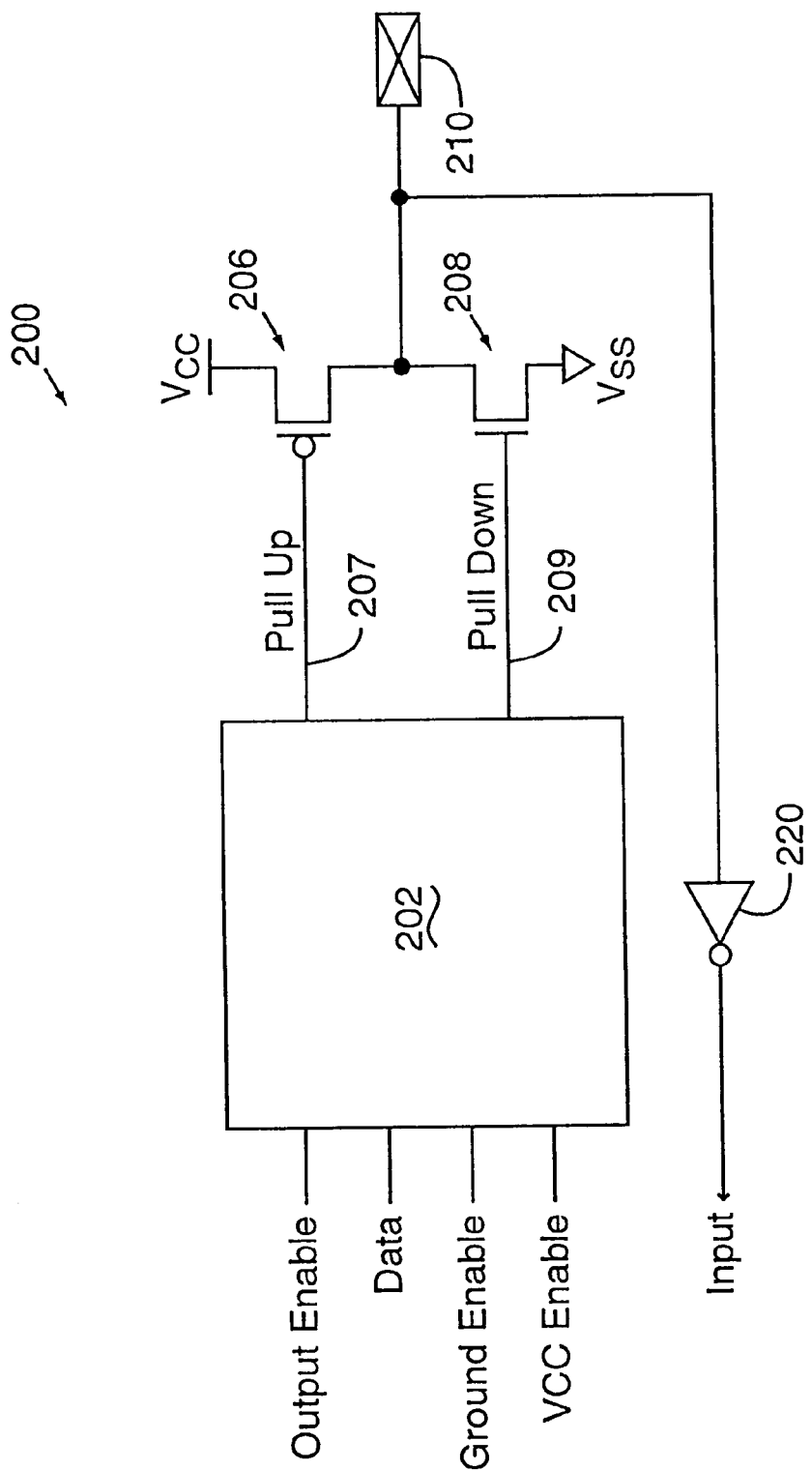
FIG. 2A illustrates a circuit diagram of a programmable pin in accordance with an embodiment of the present inventions.

To facilitate discussion of one embodiment of the present inventions, FIG. 2A illustrates a circuit diagram of a programmable pin 200. Programmable pin 200 includes a programmable circuit 202, a pull up transistor 206, a pull down transistor 208, a pad 210 and an input buffer 220. Programmable circuit 202 is connected to pull up transistor 206 and pull down transistor 208 by pull up line 207 and pull down line 209, respectively. Depending upon the signals applied to lines 207 and 209, pad 210 is configured to act as an input pad, an output pad, a power pad or a ground pad. In the illustrated embodiment, NMOS type transistors are depicted, however PMOS transistors, CMOS transistors or any other type of suitable semiconductor devices may be utilized in accordance with the present inventions with minor modifications.

In one embodiment, several control signals are applied to programmable circuit 202 in order to generate the appropriate states of pull up line 207 and pull down line 209. Output Enable (OE), Data, Ground Enable (GNDE) and VCC Enable (VCCE), in the particular embodiment, are applied to programmable circuitry 202. However, any number or type of control signals may be utilized in accordance with the present invention so long as pull up transistor 206 and pull down transistor 208 are appropriately controlled to provide the desired function.

Table 1 enumerates the states of the inputs and outputs of programmable circuit 202 in accordance with one embodiment of the present inventions.

TABLE 1

| OE | GNDE | VCCE | Pull Up | Pull Down | PAD |
|---|---|---|---|---|---|
| 0 | 0 | 0 | 1 | 0 | Tri-State/Input |
| 0 | 0 | 1 | 0 | 0 | VCC |
| 0 | 1 | 0 | 1 | 1 | GND |
| 0 | 1 | 1 | 1 | 0 | Tri-State/Input |
| 1 | 0 | 0 | DATA | DATA | Output |
| 1 | 0 | 1 | 0 | 0 | VCC |
| 1 | 1 | 0 | 1 | 1 | GND |
| 1 | 1 | 1 | DATA | DATA | Output |

When programmable circuit 202 asserts pad 210 into tri-state, pad 210 is capable of receiving inputs. Pad 210 receives input signals which are carried to input buffer 220. Input buffer 220 buffers the input and provides the input to internal circuitry. The illustrated embodiment depicts an input buffer 220 that is an inverting buffer, however, any type of buffering circuitry be utilized.

Figure 2B:
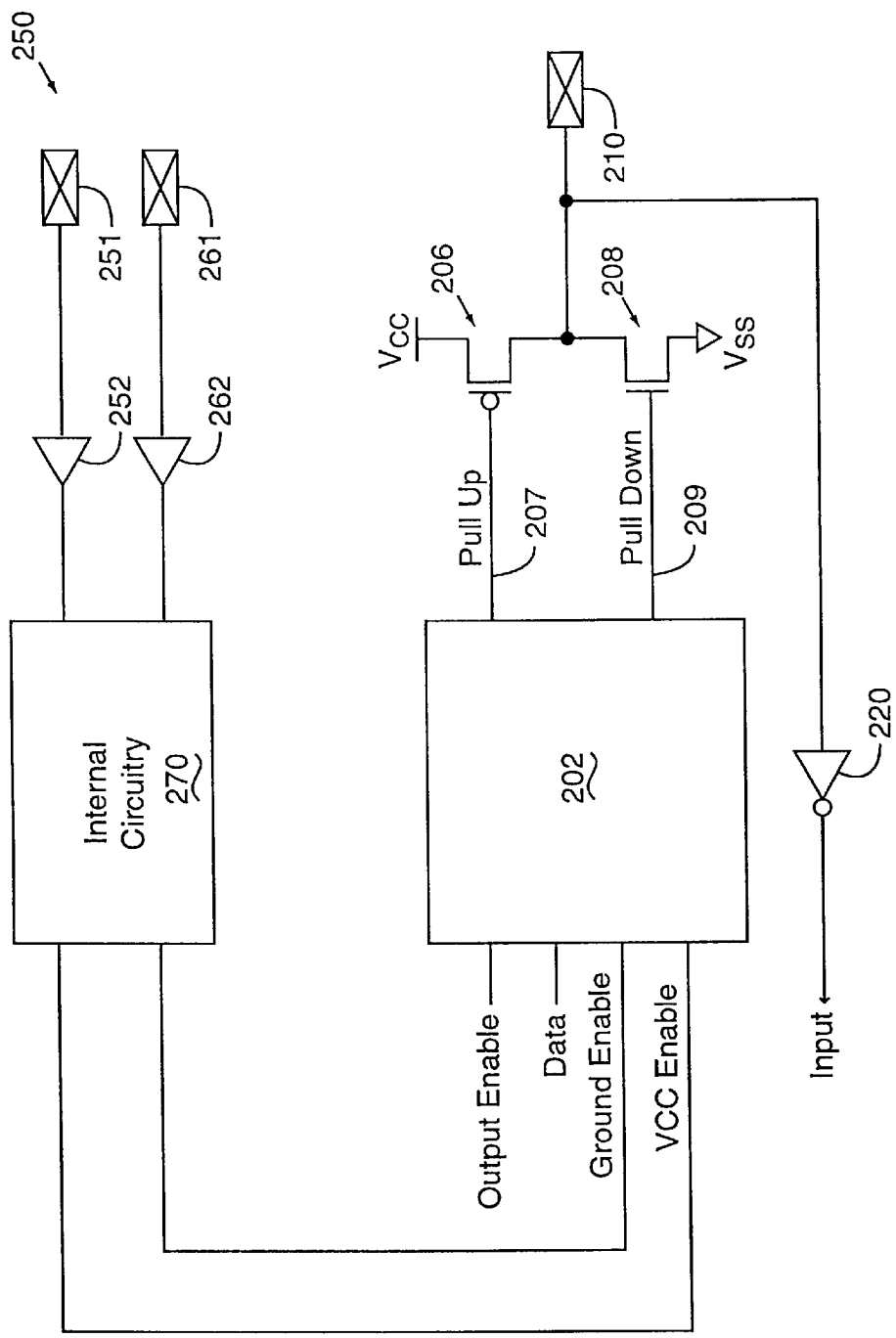
FIG. 2B illustrates a circuit diagram of a programmable pinion accordance with another embodiment of the present inventions.

In another embodiment of the present inventions, programmable circuit 202 may also be programmed. FIG. 2B illustrates a circuit diagram of a programmable pin 250 in accordance with an alternate embodiment of the present inventions. The ground enable and VCC enable inputs of programmable circuit 202 may be driven by internal circuitry 270. Internal circuitry 270 is in turn driven by signals applied to pads 251 and 261. Buffers 252 and 262 buffer the signals applied to pads 251 and 261, respectively.

Internal circuitry 270 may be any type of logic. Internal circuitry 270 may also be driven by external signals. External signals may be applied to pads 251 and 261. Buffers 252 and 262 relay the signals to internal circuitry 270. Therefore, the inputs to the ground enable and VCC enable of programmable circuitry 202 may be a function of internal circuitry and/or external signals.

Figure 3A:
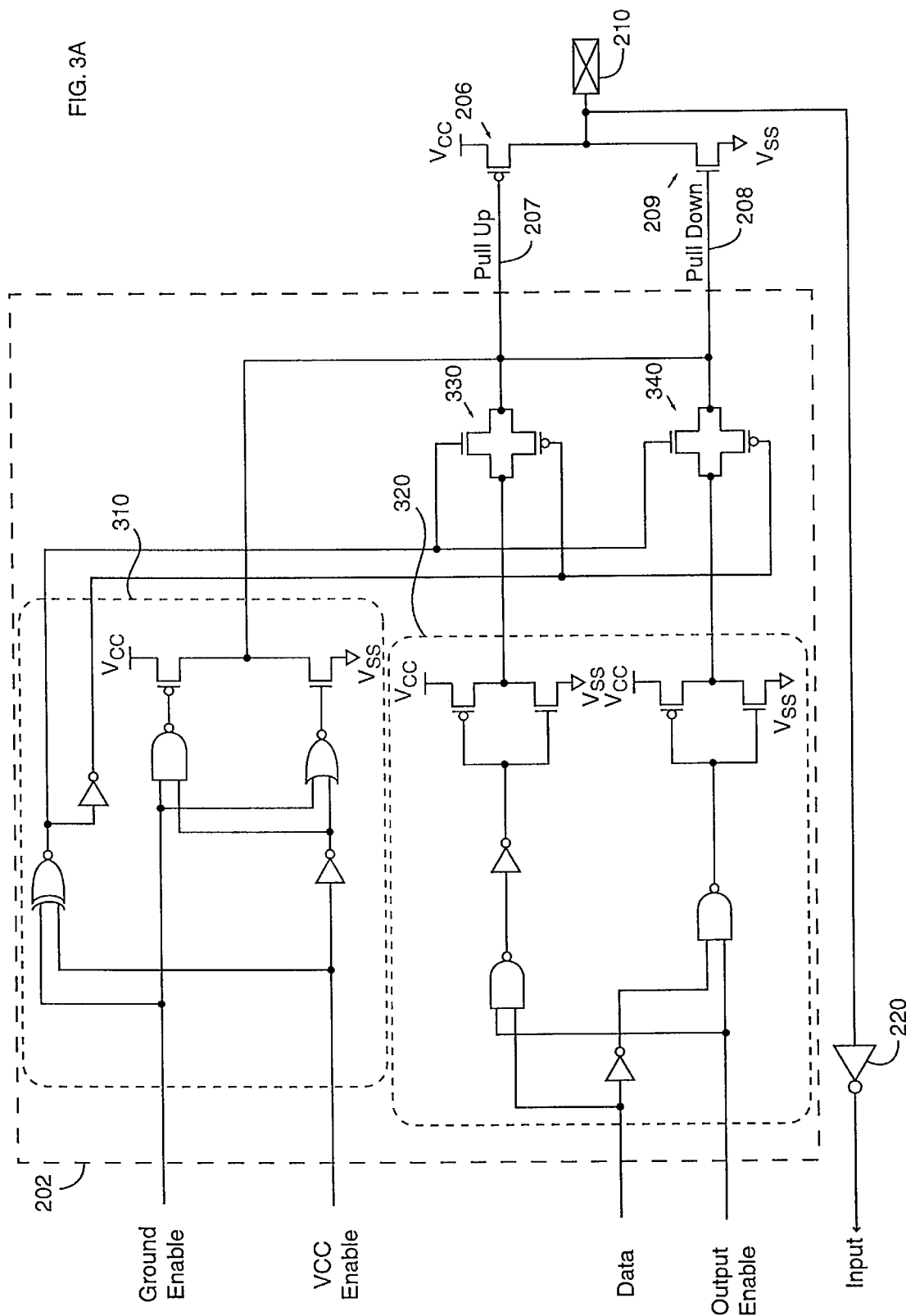
FIG. 3A illustrates a schematic diagram of a programmable circuit in accordance with an embodiment of the present inventions.

FIG. 3A illustrates a schematic diagram of programmable circuit 202 in accordance with an embodiment of the present inventions. Programmable circuit 202 includes enable control circuit 310, data control circuit 320 and buffers (or pass transistors) 330 and 340. Circuit 310 causes pull up line 207 and pull down line 208 to both be high or low, depending upon the states of the ground enable and VCC enable inputs. If both ground enable and VCC enable are the same value then the outputs, pull up line 207 and pull down line 208, are controlled by data control circuit 320.

Data control circuit 320 drives buffers 330 and 340 to output the data received by data control circuit 320. The outputs of buffers 330 and 340 transmits the data received by data control circuit 320 if the ground enable and VCC enable are the same value and output enable is asserted.

The illustrated embodiment of FIG. 3A is exemplary of a great number of alternate circuit configurations that provide the same functionality. Programmability of the input/output pads to allow them to operate as I/O, ground and power pins provides great versatility. The versatility reduces costs, increases functionality in the design and implementation of semiconductor devices.

Figure 3B:
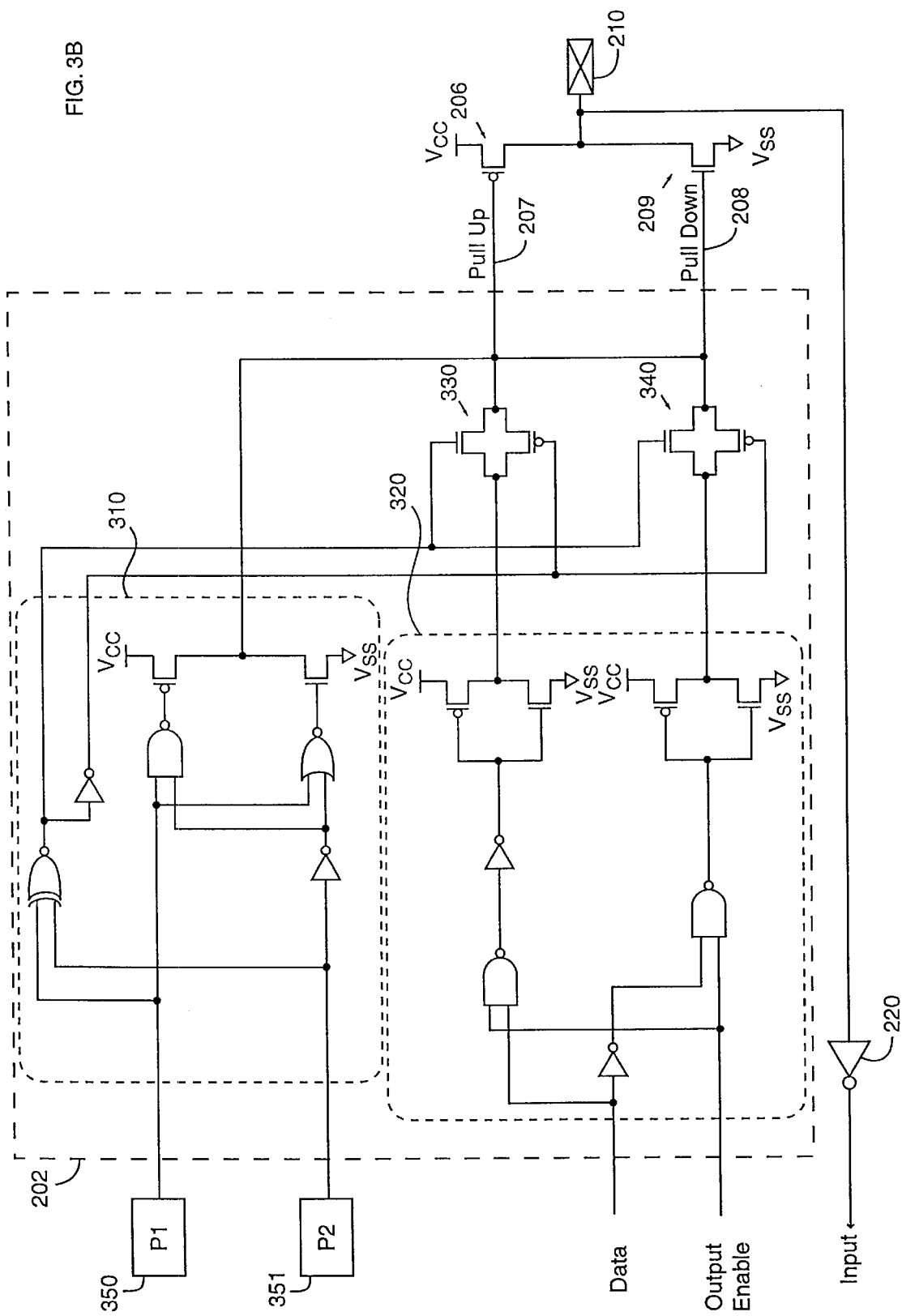
FIG. 3B illustrates a schematic diagram of a programmable circuit in accordance with another embodiment of the present inventions.

FIG. 3B illustrates an alternative embodiment of a fully programmable I/O pad circuit configuration in accordance with the present inventions. The ground enable and VCC enable inputs may be driven by programmable elements 350 and 351, respectively. Rather than internal circuitry (as in FIG. 2B) the ground and VCC enables may be programmed. Thus, a further degree of programmability and flexibility is provided. By way of example, SRAM, DRAM, EPROM, EEPROM, FLASH or any other suitable type of memory element may be utilized.

Fully programmable pads provide further benefits in addition to versatility. Often times in semiconductor devices, and especially programmable devices, a large number of pins are not utilized. Unused pins are sometimes left to float. However, the floating unused pins tend to act as antennas and generate noise within the device.

One conventional solution has been to use passive resistors to pull up or pull down the unused pins. This solution is costly in terms of board space, additional parts required to tied down the pins and increased power consumption and heat generation. Pulling up or down the unused pins also often does no alleviate the noise generated by the unused pins. Further, the problem of noise generated within the pins that are being used is not addressed.

The present inventions provide a substantially better solution. With fully programmable pins the unused pins can be used to alleviate noise, increase speed and avoid the costs of physically pulling up or down the unused pins. By configuring the unused pins, current which would normally pass through only a few dedicated power and ground pins is distributed throughout all the unused pins that have been configured to function as power or ground pins.

Noise is typically a function of inductance, which is proportional to the amount of current carried by a pin. Distributing the amount of current needed by a semiconductor device by a large number of power and ground pins decreases the amount of noise generated by the inductance of the power and ground pins. Thus, with a single solution, programmable pins, the problems of noise generated by used and unused pins are alleviated.

Further, the newly configured power and ground pins may be interspersed between active pins. Placing power and ground pins between active pins further reduces the noise generated by the active pins.

In addition to noise reduction, fully programmable pins increase performance. An increased number of power and ground pins allows a semiconductor device to draw greater current within a period of time. The ability to draw greater currents directly corresponds to the semiconductor device's ability to drive output pins at a faster rate. Also, more power and ground pins reduce the magnitude of VCC sag and ground bounce. The reduction of VCC sag and ground bounce further improve input and output performance.

At the same time the increased number of power and ground pins allows better heat dissipation. Increased current capacity, reduced noise and reduced heat also help in decreasing the amount of noise generated by the semiconductor device. These benefits, along with the decreased costs in implementing a semiconductor device with fully programmable pins add value to any semiconductor device.

In addition to programmability, the present inventions provide a pin that retains the last state of the pin. A pin with memory removes the need for internal or external pull up or pull down circuitry. Pull up and pull down circuitry typically can only drive a pin to only one value, either up or down. A pin with memory maintains the last value of the pin. A pin with memory still provides protection against spurious signals that may cause crowbar currents and other harmful effects. However, the pin with memory also provides the added benefit of maintaining the last state. Often times, retaining the last state of a pin is useful. For example, if an internal or external pull up is used while the last state is low, the weak pull up will pull the input to high at a slow rate. This may not be desirable because a slow switching input may cause crowbar currents for a short period of time. Instead, retaining the last state of a pin avoids the problem.

Figure 4A:
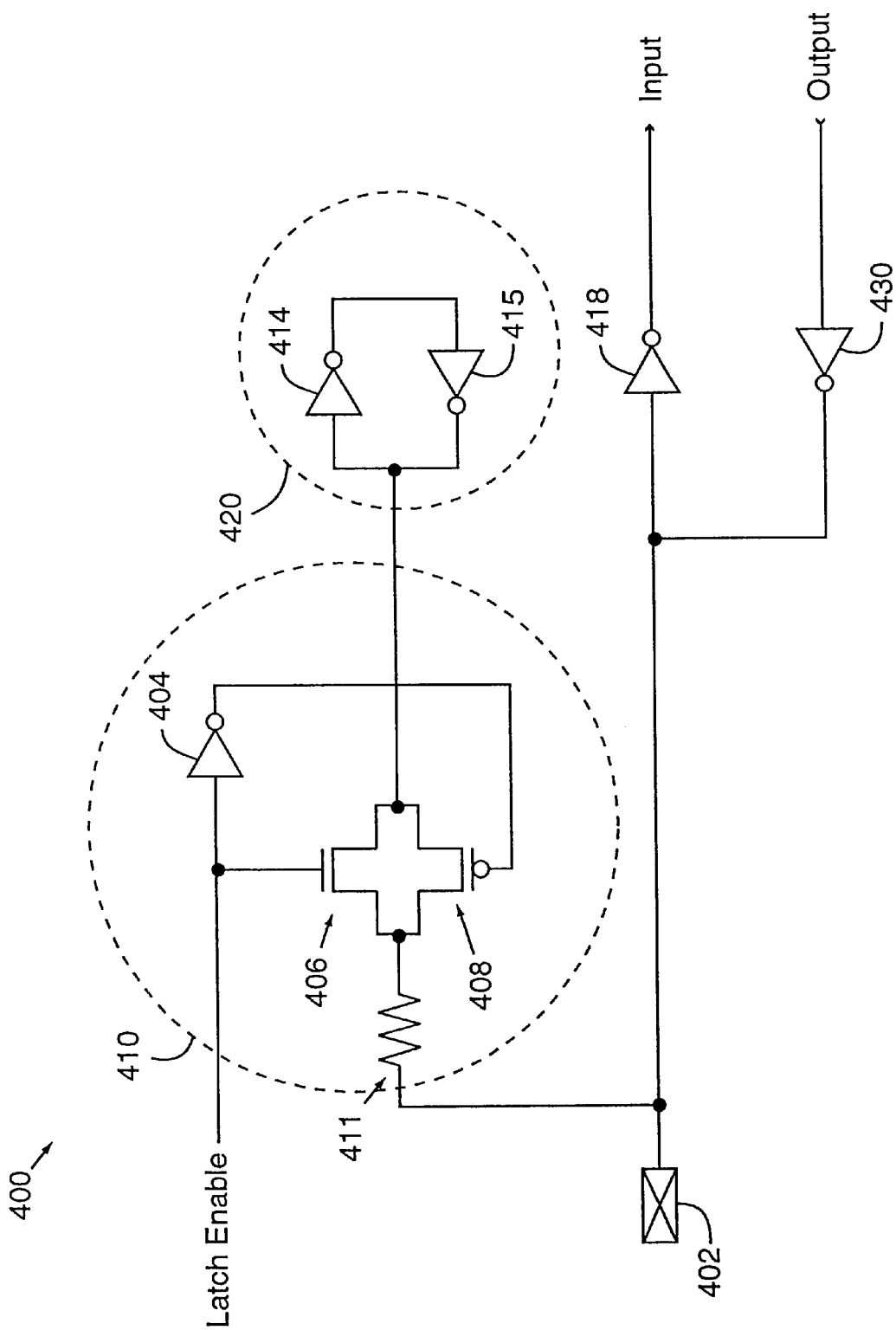
FIG. 4A illustrates a block diagram of a pin structure with memory in accordance with an embodiment of the present inventions.

FIG. 4A illustrates a block diagram of a pin structure 400 with memory in accordance with an embodiment of the present inventions. Pin structure includes a pad 402, latch select circuitry 410, latch circuitry 420, input buffer 418 and output buffer 430. Input buffer 418 and output buffer 430 are connected to pad 402 and provide buffering for the internal circuitry of the semiconductor device in which the pin structure may be implemented.

Latch select circuitry 410 enables the operation of latch circuitry 420. Latch buffer circuitry 410 includes a resistor 411, transistors 406 and 408, and buffer 404. The latch buffer circuitry is coupled to pad 402 through resistor 411. A latch enable signal is applied to transistors 406 and 408. The latch enable signal is inverted by buffer 404 before being applied to transistor 408. When the latch enable signal is high, transistors 406 and 408 are active and conduct current, but the current is limited by resistor 411. Current limiting provides protection for transistors 406 and 408 as well as for latch circuitry 420. In the active state, latch buffer circuitry 440 allows latch circuitry 420 to continually obtain the current value of pad 402. On the other band, when the latch enable signal is low the transistors 406 and 408 are switched off and latch circuitry 420 is isolated from pad 402.

Latch circuitry 420 includes two inverting buffers 414 and 415. The two inverting buffers 414 and 415 are arranged to feedback to each other. However, the outputs of the inverting buffers 414 and 415 are limited to avoid catastrophic feedback. In one embodiment, the output of each inverting buffer is on the order of 10 μ amps. The feedback loop, therefore, can be broken when a greater current is applied to pad 402 either internally or externally. However, any suitable current limit may be used depending on the size of the transistors used in buffers 414 and 415. For example, an external 10 kohm pull up resistor may source 0.3 mA if the input is driven too low by another device.

Generally, external devices drive pads, such as pad 402, with currents more than great enough to break the feedback loop of inverting buffers 414 and 415. Similarly, output buffer 430 is capable of generating enough current to break the feedback cycle of the latch circuitry. Latch circuitry 420 is continually updated in this manner with the current state of pad 402 when pad 402 is being driven by an external source or output buffer 430, provided the latch enable signal is high. When pad 402 is in tri-state, or nothing is driving pad 402, then latch circuitry 420 preserves the previous state of the pad.

Figure 4B:
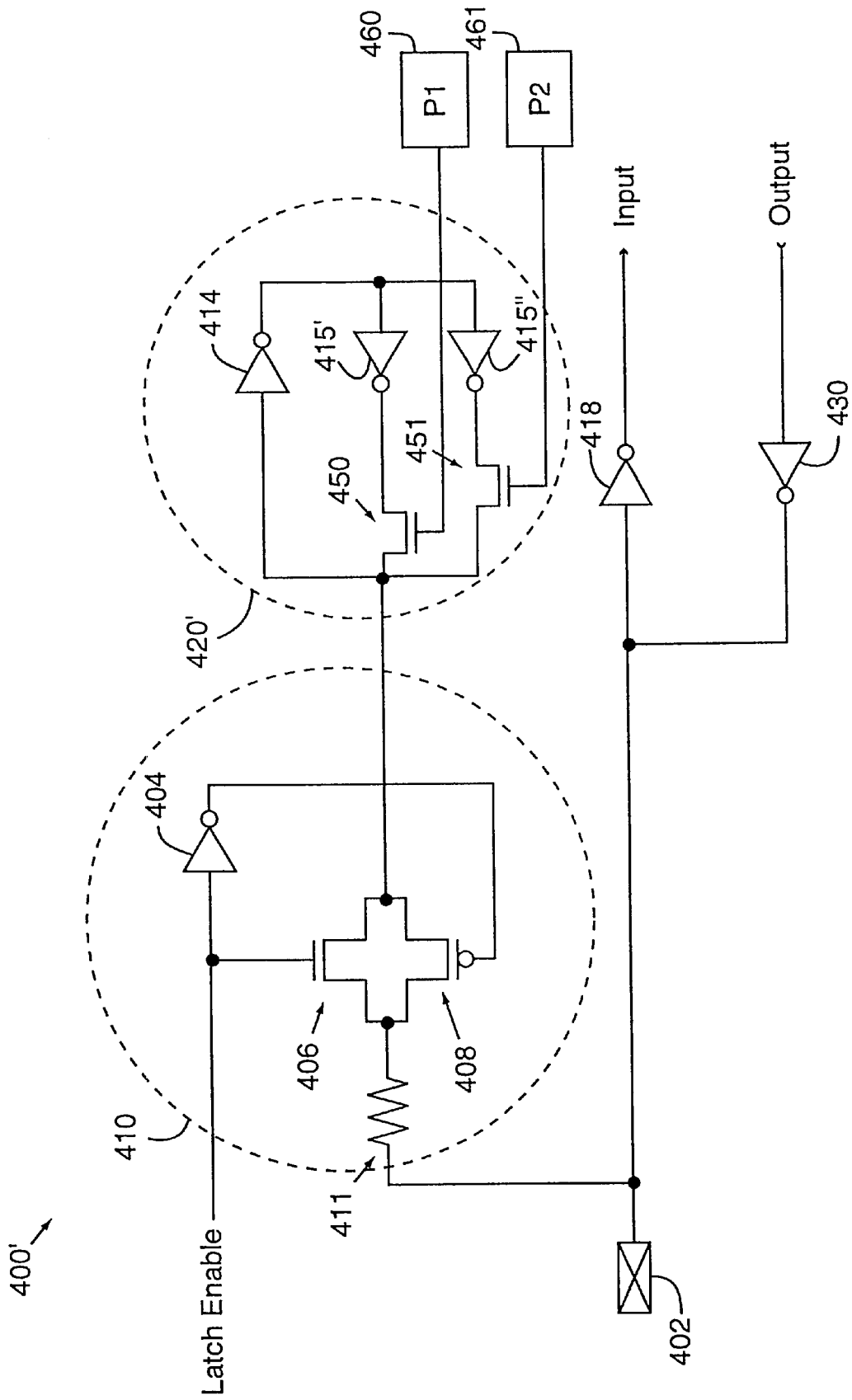
FIG. 4B illustrates a block diagram of a pin structure with memory in accordance with another embodiment of the present inventions.

FIG. 4B illustrates a block diagram of a pin structure 400' with memory in accordance with an embodiment of the present inventions. Pin structure 400' includes an alternative latch circuit 420'. Latch circuitry 420' includes inverting buffer 414, 415' and 415". Inverting buffer 415' is a 10 μA buffer, while inverting buffer 415" is a 0.3 mA buffer. The outputs of inverting buffers 415' and 415" are controlled by pass transistors 450 and 451, respectively. Pin structure 400' further includes programmable elements 460 and 461.

Programmable elements 460 and 461 may be programmed to determine which of the two buffers 415' and 415" is active. Programmable elements 460 and 461 drive pass transistors 450 and 451 to select one of the buffers 415' or 415". Buffer 415' is selected when less leakage current is desired. Buffer 415" is selected when better noise immunity is desired. Of course, any suitable number or type of buffers may be implemented to provide further flexibility in the choice of properties of latch circuitry 420'. The user is provided the ability to choose the size of the current used in latch circuitry 420' to optimize the noise and leakage current trade-offs.

Programmable elements 460 and 461 may be any type of programmable or logic element. By way of example, SRAM, DRAM, EPROM, EEPROM, FLASH or any other suitable type of memory element may be utilized. Also, internal circuitry may control the activation of pass transistors 450 and 451 rather than programmable elements 460 and 461. The internal circuitry may also be driven by external signals applied to input pins coupled to the internal circuitry.

Figure 5:
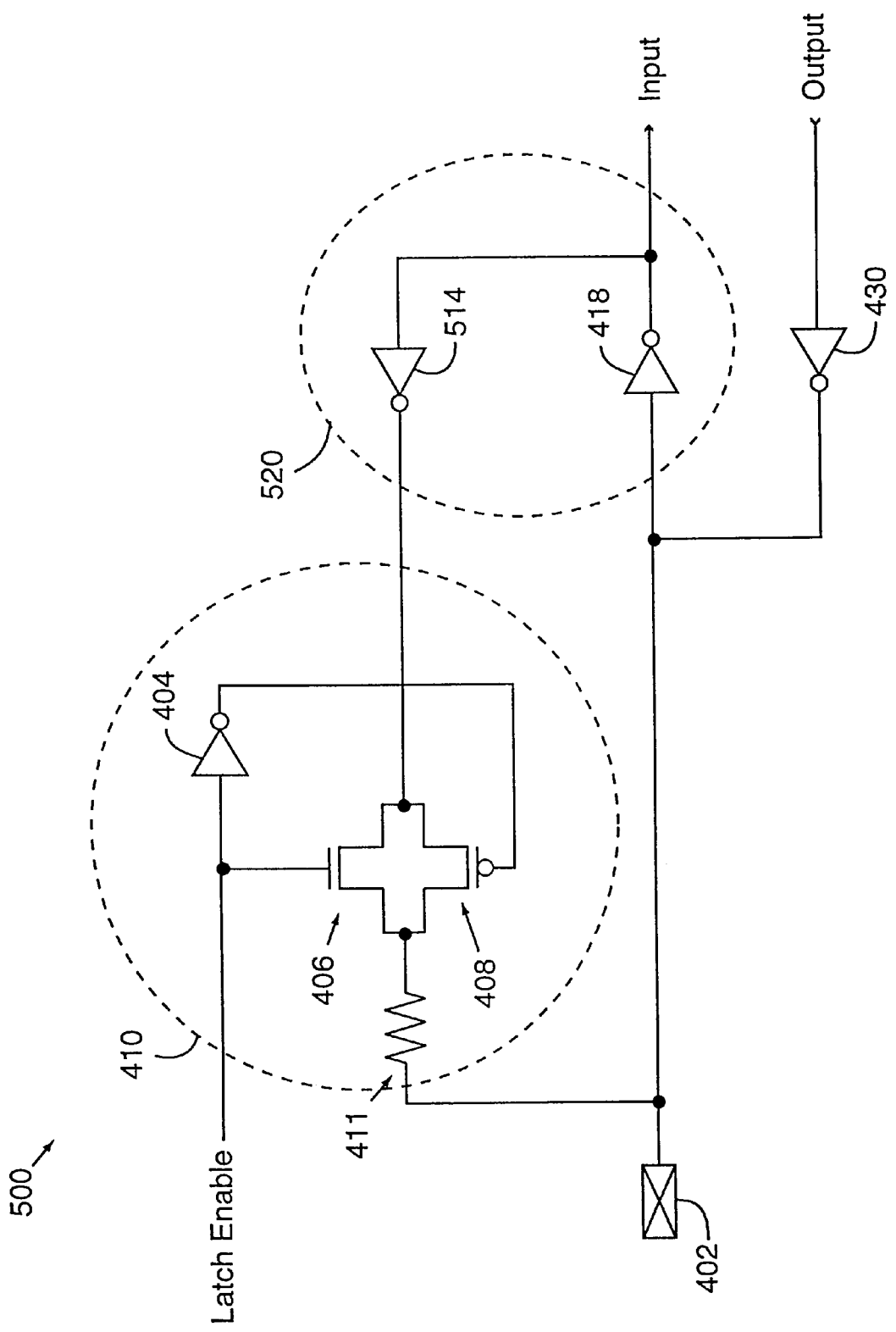
FIG. 5 illustrates a block diagram of a programmable pin structure with memory in accordance with another embodiment of the present inventions.

FIG. 5 illustrates a block diagram of a pin stricture 500 with memory in accordance with another embodiment of the present invention. The pin structure is similar to that of the pin structure discussed in reference to FIG. 4A. The primary difference is the alternate configuration of latch circuitry 520.

Instead of two inverting buffers in a feedback mode, latch circuitry 520 includes an inverting buffer 514 that receives the output of input buffer 418. Input buffer 418 is also inverted in the particular embodiment: Thus, a feedback loop is formed between input buffer 418 and buffer 514.

Again, latch buffer circuitry 410 and the latch enable signal enables or disables latch circuitry 520. If enabled, buffer 514 provides a weak output that does not interfere with the normal operation of pad 402, but does maintain the previous state when pad 402 is not being driven by output buffer 430 or an external device.

Referring to FIGS. 4A, 4B and 5, the elements of the different embodiments of the present invention are depicted as NMOS devices, however any suitable type of semiconductor device may be utilized. Additionally, alternative variations and permutations of the illustrated embodiments fall within the scope of the present inventions. By way of example, non-inverting buffers may be utilized instead of inverting buffers in the latch circuitries depicted.

Pins with memory alleviate the need for pull up or pull down circuitry, either within the chip or externally. Especially in the case of external pull up and pull down circuitry, the costs of such elements are prohibitive. Resistors and other devices may be required to adequately pull up or pull down a pin. Resistors also take up a significant amount of board space Additionally, discrete resistors are of lesser quality than those formed within a semiconductor device, and may cause significant manufacturing difficulties as well as quality and reliability problems.

The use of internal pull up or pull down circuitry severely limits the flexibility of the semiconductor device. The pin is permanently pulled up or down with no possibility of changing the configuration of the pin. If external circuitry is connected to the pulled up or pulled down pin the external circuitry may be required to match the type of configuration of that pin. Another concern is that the configuration of the pulled up or pulled down pin may be detrimental to performance or power consumption in a particular implementation.

Pins with memory avoid the problems of leaving a pin floating, but at the same time provides added flexibility. No external circuitry is required, which saves board space and increases reliability.

The ability to retain the last state on a pad is often times a useful feature in logic devices. Also, the ability to program a pad to act as an input, output, power or ground pin increases the potential uses of a semiconductor device. This is especially true in programmable logic devices. By way of example, one or more of the aspects of the present invention may be implemented in field programmable gate arrays, application specific integrated circuits or any other suitable semiconductor device.

Figure 6:
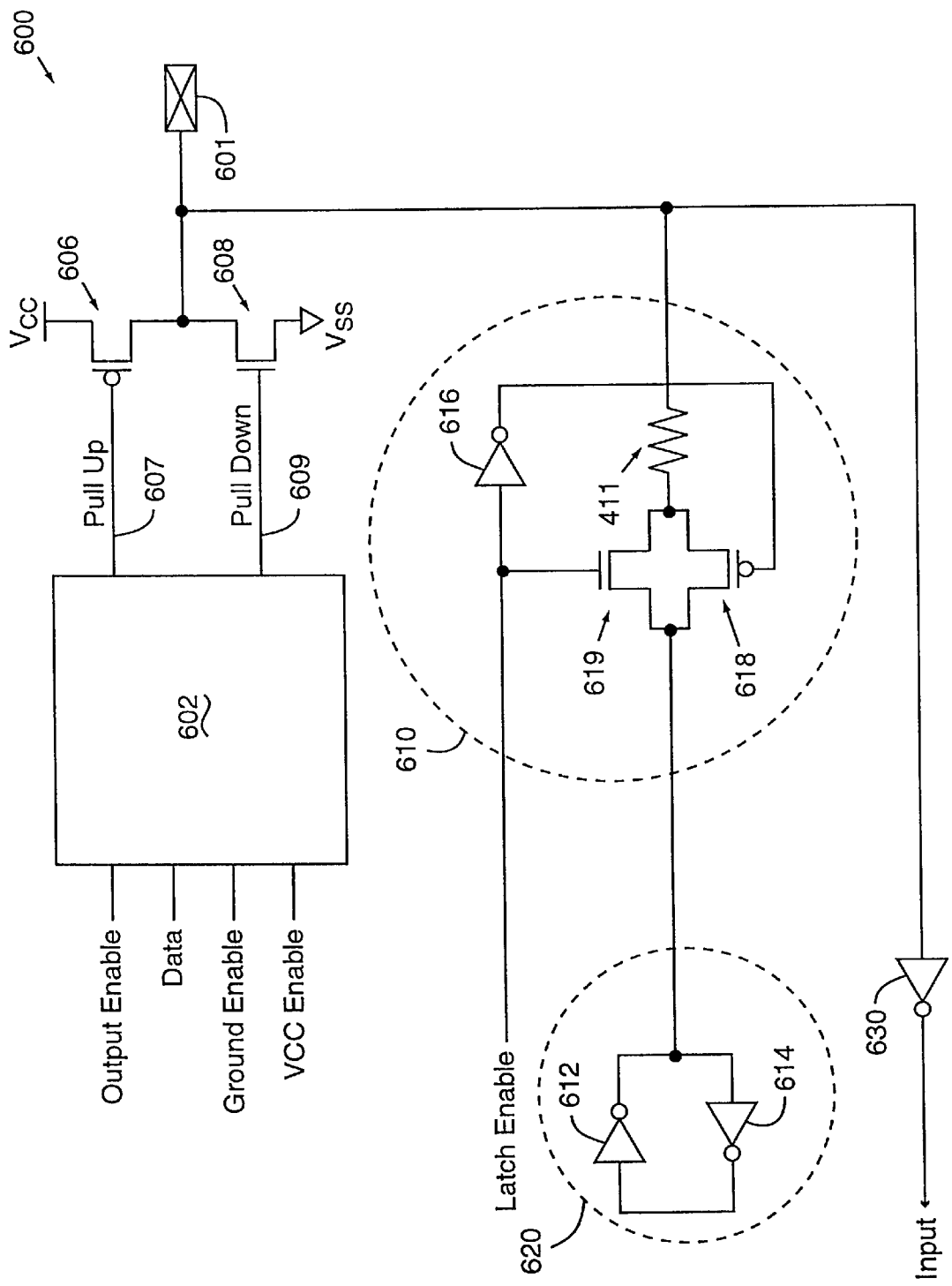
FIG. 6 illustrates a block diagram of a pin structure that is fully programmable and with memory in accordance with another embodiment of the present inventions.

FIG. 6 illustrates a block diagram of a pin structure 600 that is fully programmable and with memory in accordance with yet another embodiment of the present invention. Pin structure 600 includes a pad 601, programmable circuit 602, pull up transistor 606, pull down transistor 608 latch enable circuitry 610, latch circuitry 620 and input buffer 630.

Programmable circuit 602, pull up transistor 606 and pull down transistor 608 operate to allow the configuration of pad 601 as an input, output, power or ground pad, as discussed in detail with reference to FIGS. 2A, 2B, 3A and 3B. In another embodiment, resistors may be added in series with pull up transistor 606 and/or pull down transistor 608. Adding transistors provide resistive pulling, which may be useful in many applications.

In addition to programmability, the illustrated embodiment includes a memory function, discussed in detail with reference to FIGS. 4A, 4B and 5. Latch circuitry 620 includes two buffers 612 and 614 that provide a weak feedback loop that preserves the last state of pad 601. Latch enable circuitry 610 includes buffer 616 and transistors 618 and 619 that allows the latch circuitry to obtain the current state of pad 601.

The combination of programmability and memory provides a truly versatile and powerful feature not found in typical prior art semiconductor devices. The benefits of programmability and memory create synergistic benefits, such as noise reduction, decreased costs in implementation, greater heat dissipation, better reliability and added flexibility.

The present inventions have been discussed in terms of pins and semiconductor devices, however, the present inventions apply to analogous devices. By way of example, a programmable pin includes different types of pins used in different types of devices, such as leaded chip carrier, pin grid array, ball grid array or any other suitable pin types. The present invention also applies to all types of integrated circuit devices, including semiconductor integrated circuit devices, programmable logic devices, application specific integrated circuits, multi-chip module devices, or any other suitable types of devices.

While this invention has been described in terms of several preferred embodiments, it is contemplated that alternatives, modifications, permutations and equivalents thereof will become apparent to those skilled in the art upon a reading of the specification and study of the drawings. It is therefore intended that the following appended claims include all such alternatives, modifications, permutations and equivalents as fall within the true spirit and scope of the present invention.

What is claimed is:

1. A method of programming a mode of operation of a programmable pin by way of a programmable pin circuit coupled thereto, the method comprising:

coupling a memory circuit to the programmable pin circuit such that the programmable pin circuit does not include a pull up circuit and a pull down circuit;

coupling a programmable circuit to an output buffer and the memory circuit, the output buffer coupled to a pad, the pad configured to carry a signal and coupled to an input buffer, wherein the programmable circuit determines one of a plurality of modes in which the programmable pin is operating based upon a one or more control signals; and applying a set of values for the one or more control signals to configure the programmable circuit to select the one of the plurality of modes in which the programmable pin is operating.

2. The method of claim 1, wherein the set of values is a first set of values for the one or more control signals that configures the programmable circuit to select a first mode of the plurality of modes in which the programmable pin is operating is the signal pin mode.

3. The method of claim 1, wherein the set of values is a first set of values for the one or more control signals that configures the programmable circuit to select a first mode of the plurality of modes in which the programmable pin is operating that is an input pin mode, wherein the programmable circuit disables the output buffer to allow the input buffer to provide the signal carried on the pad to the internal circuit.

4. The method of claim 1, wherein the set of values is a first set of values for the one or more control signals that configures the programmable circuit to select a first mode of the plurality of modes in which the programmable pin is operating that is an output pin mode, wherein the programmable circuit drives the output buffer to assert the signal on the pad.

5. The method of claim 4, wherein the first set of values for the one or more control signals is a data signal which is received by the programmable circuit and the programmable circuit drives the output buffer to assert, the data signal on the pad.

6. The method of claim 5, wherein the set of values is a first set of values for the one or more control signals that configures the programmable circuit to select a first mode of the plurality of modes in which the programmable pin is operating that is an input/output mode, wherein the programmable circuit drives the output buffer to assert the signal on the pad and the input buffer provides the signal carried by the pad to the internal circuit.

7. The method of claim 6, wherein the set of values is a first set of values for the one or more control signals that configures the programmable circuit to select a first mode of the plurality of modes in which the programmable pin is operating that is a power pin mode.

8. The method of claim 7, wherein the set of values is a first set of values for the one or more control signals that configures the programmable circuit to select a first mode of the plurality of modes in which the programmable pin is operating that is a power supply pin mode, wherein the programmable circuit drives the output buffer to assert the signal on the pad, the signal being a power supply signal.

9. The method of claim 8 wherein the set of values is a first set of values for the one or more control signals that configures the programmable circuit to select a first mode of the plurality of modes in which the programmable pin is operating that is a ground pin mode, wherein the programmable circuit drives the output buffer to assert the signal on the pad, the signal being a ground signal.

10. A programmable pin circuit, for use in an integrated circuit device, for selectively configuring a integrated circuit device pin to operate in one of a plurality of modes, comprising:

a programmable circuit that determines which of the modes in which the programmable pin may operate based upon a number of control signals, wherein the plurality of modes includes a power pin mode, an input pin mode, an output pin mode, an input/output pin mode; and a memory circuit coupled to the programmable circuit arranged to retain a last state of the programmable pin, wherein the programmable pin circuit does not include an internal pull up circuit and an internal pull down circuit.

11. A programmable pin circuit as recited in claim 10, wherein the control signals of the programmable pin circuit are programmable.

12. A programmable pin circuit as recited in claim 10 wherein the control signals include a data signal which is received by the programmable circuit and the programmable circuit drives an output buffer coupled to the programmable circuit to assert the data signal on a pad coupled to the output buffer.

13. A programmable pin circuit as recited in claim 12, wherein the output buffer asserts a previous state on the pad and subsequently asserts a next state on the pad, the memory circuit asserts the previous state on the pad in an interval between the assertion of the previous state and the next state by the output buffer.

14. A programmable pin circuit as recited in claim 13, wherein when an external source asserts the previous state on the pad and subsequently asserts the next state on the pad, the memory circuit asserts the previous state on the pad in an interval between the assertion of the previous state and the next state by the external source.

15. A programmable pin circuit as recited in claim 13, wherein the output buffer asserts the previous state on the pad and an external source subsequently asserts the next state on the pad, the memory circuit asserting the previous state on the pad in an interval between the assertion of the previous state by the output buffer and the next state by the external source.

16. A programmable pin circuit as recited in claim 13, wherein an external source asserts the previous state on the pad and the output buffer subsequently asserts the next state on the pad, the memory circuit asserting the previous state or the pad in an interval between the assertion of the previous state by the external source and the next state by the output buffer.

17. A programmable pin circuit as recited in claim 10, wherein the programmable pin is connected to an integrated circuit.

18. A programmable pin as recited in claim 17, wherein the integrated circuit is a programmable logic device.

* * * * *